United States Patent [19]

Cayzac et al.

[11] 4,143,365

[45] Mar. 6, 1979

[54] DEVICE FOR THE ACQUISITION AND STORAGE OF AN ELECTRICAL SIGNAL

[75] Inventors: Jacques C. Cayzac, La Varenne, France; Claude J. P. F. le Can, Nijmegen, Netherlands; Roger Brun, Creteil, France; Jacques Devillers, Paris, France; Etienne Joinnet, Saint-Maur, France

[73] Assignee: U.S. Philips Corporation, New York, N.Y.

[21] Appl. No.: 754,969

[22] Filed: Dec. 28, 1976

[30] Foreign Application Priority Data

Dec. 31, 1975 [FR] France .................................. 75 40323
Dec. 14, 1976 [FR] France .................................. 76 37687

[51] Int. Cl.² .......................................... H03K 13/02
[52] U.S. Cl. ............................ 340/347 SH; 307/353; 328/135; 328/151; 340/347 NT; 340/799
[58] Field of Search .... 340/347 M, 347 SH, 347 AD, 340/347 NT, 324 AD; 328/151, 135; 324/77 A, 103 P; 307/351–354, 360

[56] References Cited

U.S. PATENT DOCUMENTS

| 3,541,444 | 11/1970 | Prozeller | 340/347 M |
|---|---|---|---|
| 3,576,948 | 5/1971 | Stauffer | 179/15.55 |
| 3,737,897 | 6/1973 | Cuthbert et al. | 340/347 AD |
| 3,851,309 | 11/1974 | Kenney et al. | 340/347 SH X |
| 3,882,489 | 5/1975 | Guggolz | 340/347 SH |
| 3,924,078 | 12/1975 | Bussey | 324/103 P X |
| 3,973,197 | 8/1976 | Meyer | 324/103 P |
| 4,001,604 | 1/1977 | Parks et al. | 340/347 SH X |

OTHER PUBLICATIONS

The Engineering Staff of Analog Devices, Inc., Analog-Digital Conversion Handbook, 1972, pp. I-75,III--84, 85, I-29-31.
Hatsios, Analog Detection and Storage Circuit, IBM Technical Disclosure Bulletin, vol. 13, No. 3, 8/1970, p. 761.

Primary Examiner—Thomas J. Sloyan
Attorney, Agent, or Firm—Frank R. Trifari; Henry I. Steckler

[57] ABSTRACT

A device for the acquisition and storage of an electrical signal.

The signal is divided into adjoining elementary time intervals of specific duration. During each of them the amplitude minimum and amplitude maximum of the signal are established, which values are first stored in analog form and subsequently in digital form.

The device may be utilized in oscilloscopes, in particular those of the type comprising a matrix display panel.

6 Claims, 17 Drawing Figures

DEVICE FOR THE ACQUISITION AND STORAGE OF AN ELECTRICAL SIGNAL

The invention relates to a device for the acquisition and storage of an electrical signal, which signal is divided into adjoining elementary time intervals of specific duration, comprising at least one information acquisition element, which information is constituted by the amplitude minimum and the amplitude maximum which the signal assumes during an elementary time interval, Dividing an arbitrary electrical oscillation into elementary time intervals is a technique which is known per se.

Such a technique is actually used in all devices employing the sampling method. This sampling method, which is also known and which at present is frequently used for processing and analyzing an electrical signal, consists of determining the amplitude of the electrical signal at precise instants. These instants are of negligible duration relative to the equal elementary time intervals between these instants. The sampling frequency, i.e. the frequency with which, the instantaneous amplitude of the electrical signal is determined, or which unambiguously determines the duration of the elementary time intervals between two instants, should be substantially higher than the highest signal frequency. This requirement presents problems in realizing devices in accordance with the conventional method and designed for very high signal frequencies.

This type of method only provides information in the form of the instantaneous signal amplitudes at the ends of the elementary time intervals. However, no information is obtained about the signal behaviour during the time interval itself, because only the ends of the interval are considered.

Pure transient effects, for example, can only rarely be detected by equipment of the conventional type.

Moreover, it is frequently very useful not only to know the signal amplitude at specific instants, but also the limits of the signal during time intervals whose length is adjustable. Sometimes information is also needed in respect of the shape and magnitude of the signal envelope.

If it is moreover desired to store the signal for a comparatively long time, a large and expensive memory is indispensible.

It is one of the objects of the invention to propose a device which enables the loss of information to be avoided and which provides more complete and more directly usable information about the analyzed signal, yet without having a high storage capacity. Furthermore, this method is highly flexible, and may be employed in several fields, such as oscilloscopic displays, computerized signal analysis etc.

From U.S. Pat. No. 3,576,948 it is known to reproduce signals of higher frequency on a display apparatus which has a lower frequency response. For this purpose the maximum value and the minimum value of the signal during a time interval is determined in consecutive time intervals and stored in an analog memory. Subsequently, these values are applied to the display apparatus.

A drawback of this known arrangement is that the duration of the sampling intervals should depend on the maximum speed of response of the display apparatus, i.e. on its frequency response, if a more or less faithful reproduction of the high-frequency signal is necessary or desirable.

The invention is based on the recognition that the sampling signals must be processed independently of the actual sampling process.

For this purpose the device in accordance with the invention is characterized in that the device comprises at least one analog-to-digital converter which converts said information into digital values and a digital information store for storing the digital values which correspond to the amplitude maximum and the amplitude minimum of the electrical signal during at least one elementary time interval.

In this respect it is advantageous that the device can simply be adapted to the highest frequency of the applied electrical signal to be measured and to be reproduced faithfully by the choice of the sampling time interval, by the choice of the measuring times of the analog-digital converters and by the choice of the storage capacity of the digital storage means. The digital information stored in said storage means can then be processed further in a suitable manner.

For simply converting the measured maximum value and minimum value into a digital value use is made, in accordance with the invention, of a converter which is characterized in that the analog-to-digital converter of the amplitude-time type, provided for digitally coding the two amplitudes of which one amplitude is always higher than the other, comprises a single constant-current calibration generator and two digital counting circuits which at two outputs produce the digital value of the upper voltage and the digital voltage of the difference between the two voltages respectively.

In accordance with an aspect of the invention an information processor is included in series between the converter and the digital storage means, which processor comprises digital comparator circuits which determine the maximum (or the minimum) of the maxima (or of minima respectively) which the signal assumes during a specific number of elementary time intervals, said number being programmable by means of a digital counting circuit. As a result, the device has a much greater flexibility of operation.

It is to be noted that from the German Patent Application DT 23 37 124 which has been laid open for public inspection it is known to constantly compare digital values from an analog-to-digital converter by means of digital comparators with previously stored minimum and maximum values, so that always the maximum and the minimum value over a longer time interval is known. However, these values are employed for determining an average, which is available in the form of an output signal.

In accordance with another aspect of the invention, an oscilloscope which utilizes the device is characterized in that the digital storage means is a buffer memory which is read-in with a high speed and read out with a slow speed in accordance with the response times of matrix display devices. For this use is preferably made of an embodiment which is characterized in that for each column under consideration of the display system all the points which are situated between the two points which respectively correspond to the digitized values of the amplitude maximum and amplitude minimum which the signal assumes during the measuring time interval (ITM) corresponding to the column under consideration are activated successively.

In comparison with known display systems, which employ signal sampling and which display one measurement value per time interval, this embodiment in accordance with the invention offers a substantial improvement in respect of the accurate reproduction of the signal waveform, but moreover it enables a slow matrix display panel to be used for displaying fast phenomena and the matrix properties of such a display panel to be utilized in a simple manner.

The following description with reference to the attached drawing, given by way of example, will enable the invention to be more fully understood, FIG. 1 illustrates the prior-art method.

FIG. 3 illustrates the operation of a device in accordance with the invention.

Sampling of the relevant signal SIG is effected at the exact instants $A_1$, $A_2$ ... (which are separated by equal elementary time intervals) at times $t_1$, $t_2$ etc. at each of which the instantaneous amplitude of the signal is measured. Each of these instants is of negligible duration in comparison with the elementary time interval (designated I.T.E.) between two successive instants.

In this respect the type of error is to be noted which may be introduced with such a prior-art device. The signals SIG1 (continuous line) and SIG2 (dotted line) are analyzed in the same way. The shape and the limits of a signal will be false when such a method is used, because no information is available about the signal behaviour between two instants.

In order to avoid this it is necessary to have a sampling frequency which is substantially higher (by a factor from 5 to 10) than the highest frequency Fs of the relevant signal.

However, if the information about the signal is to be stored for a relatively long time the required storage capacity will be very large.

Figure 1:
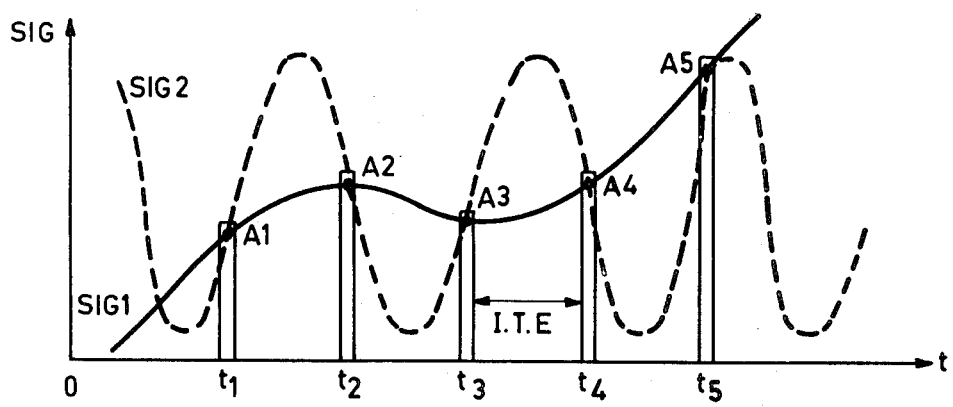
FIG. 1 is representative of at least one difficult situation which may occur when the relevant prior-art device is used.
Figure 2:
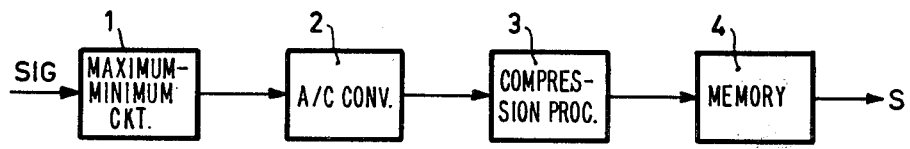
FIG. 2 is a block diagram representing the various stages of the device in accordance with the invention.

FIG. 2 represents the various stages of the device in accordance with the invention.

The signal as a function of time, which has the general reference SIG, is first of all processed in a first stage which comprises at least one signal processor 1, referred to as M.M.C. hereinafter.

The function of this processor is to receive the electrical signal and to select from this signal the information which is required only in further steps of the method described hereinafter. This information is constituted by the value of the amplitude minimum and the amplitude maximum assumed by the relevant electrical signal during an elementary time interval.

The next stage consists of at least one analog-to-digital converter 2 (designated A/O), which transforms and codes the acquired analog information into digital information (the amplitude value being represented by a number of pulses counted.) The information which is available in digital form at the output of this converter will consequently be representative of the information obtained in analog form during the first step of the method.

Preferably, this information, which is now available in digital form, is then processed during a subsequent step so as to compress it (information processor 3), in order to obtain a higher flexibility of operation of the device in accordance with the invention.

This processor enables the range of application of the device to be extended considerably without the use of a large memory in the last step of the method in accordance with the invention, i.e. the storage of the information.

Eventually, the digitized information which corresponds to the processed signal is stored in the memory 4.

This may be realized in different manners depending on the desired application.

For example, in the case of oscilloscopic displays, for which such a method is particularly suitable, such a memory may be a buffer memory.

The high-frequency signal which is applied to the input is then processed in accordance with the various steps of the method and after this it must be displayed. However, display devices in accordance with the latest techniques do not always have suitable response curves. This is particularly so for matrix display devices (constituted inter alia by liquid crystals or light-emitting diodes, etc.).

Thus, this buffer memory, which functions as a regulator, enables a fast signal to be displayed by a display device which is less fast.

Thus, the information obtained in S at the end of the various steps of the method, can then be decoded and displayed very easily.

One of the principal advantages of the present method, however, is its great adaptability.

Indeed, it is also possible to make direct use of the method for signal analysis. The output of the device in accordance with the invention may then be connected to a computer, said output corresponding to point S in the diagram of the method (FIG. 2). The adaptation will be direct and requires no special measures.

FIG. 3 shows the operation of the device in a practical manner.

The input processor M.M.C. is quadrupled in this Figure, which represents an embodiment of the device in which each of the sections designated M.M.C1, M.M.C2 etc, receives the input signal.

The reason for this multiplicity resides in the actual information acquisition process by means of these sections.

Figure 3A:
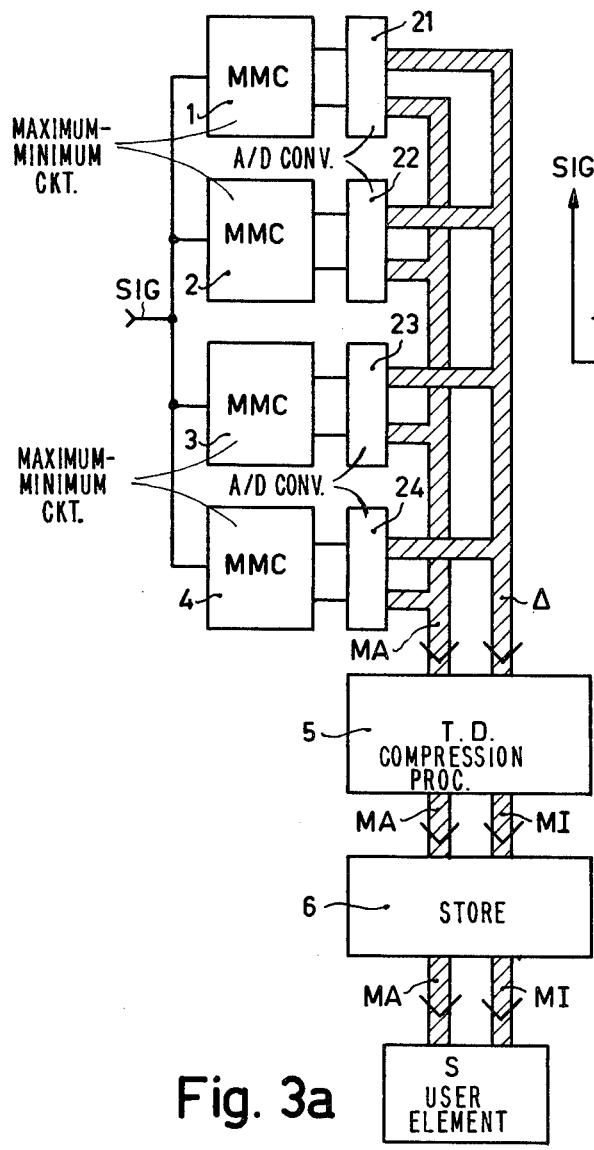
FIG. 3a is a block diagram of the device in accordance with the invention.
Figure 3D:
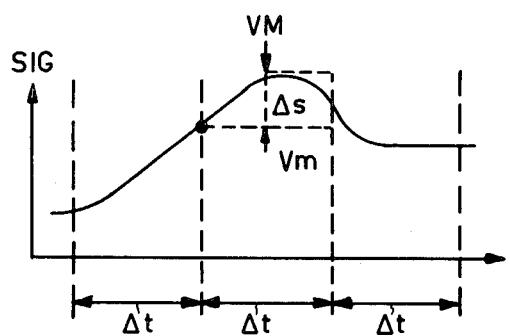
FIG. 3d illustrates the information acquisition.
Figure 3B:
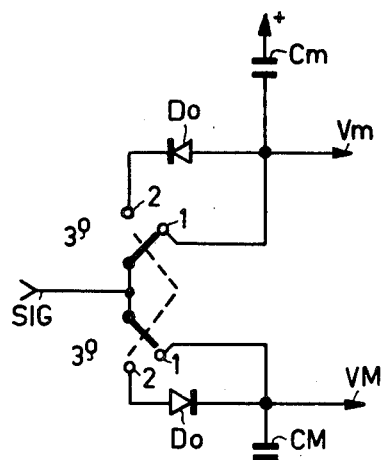
FIG. 3b is a diagram in explanation of the information acquisition process.

Reference should therefore be made to the diagram of FIG. 3b, which illustrate the last-mentioned process and corresponds to an example of a device in accordance with the invention.

Figure 3C:
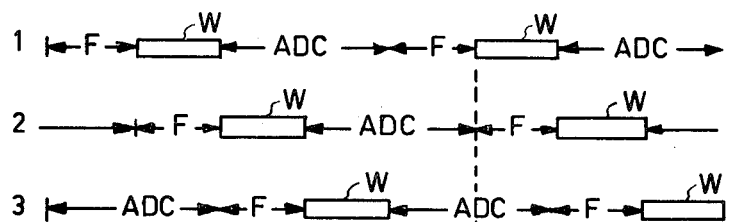
FIG. 3c is the time-diagram of the sequence of operational time intervals for each information-acquisition element.

The signal designated SIG, which is applied to the input of an MMC circuit is applied to a duplicated 3-way switch whose three positions which correspond to specific successive operational time intervals (designated I.T.O.) in which the signal is processed, indicated in FIG. 3c. During each operational time interval a different operation is performed.

During the first operational time interval F (from "follow") which corresponds to the first of the three switch positions the signal simultaneously charges the two capacitors Cm and CM connected to the positive supply terminal and the negative supply terminal respectively. Consequently, the capacitors Cm and CM which at the beginning of the interval F had an arbitrary charge, will ultimately have a charge Q, (Qm for Cm, QM for CM), which follows (hence the designation F) the amplitude V of the input signal SIG in time, in conformity with the well-known proportionality law Q = CV, whilst it is assumed that the capacitors Cm and CM have no losses for the present analysis of the information acquisition process.

During the operational time interval which follows F, and which is designated W (from window), corresponding to the second of the three positions, the capacitors Cm and CM are respectively charged to the value corresponding to the amplitude minimum (Vm) and the amplitude maximum (VM) respectively by means of two semiconductor diodes Do, which in this analysis of the information acquisition process are assumed to be ideal (zero threshold voltage).

As the semiconductor diodes prevent a current in the reverse direction, the capacitors Cm and CM will behave as analog memories which during the whole interval W, and only during this time window (hence the designation W), receive a signal to store the value of the amplitude minimum and the amplitude maximum in the form of two charges Qm and QM respectively.

FIG. 3d also illustrates the information taken into account by this process. In an elementary time interval $\Delta t$, the minimum value Vm and the maximum value VM are retained, which yields $\Delta s = VM-Vm$.

If during an elementary time interval $\Delta t$ the signal has more than one minimum and more than one maximum, i.e. if the highest frequency Fs of this signal is higher than the value $1/\Delta t = F_M$, the signal envelope will be recovered owing to this process. In the case that the signal has a frequency Fs which is lower than FM, the signal itself will be stored.

In order to avoid any ambiguity the input stage of the device may be preceded by a filter which is adjusted to the sampling frequency $F_M$.

During the last operational time interval of an operational sequence as described here, which interval adjoins W and is designated ADC (from analog-to-digital conversion), which last operational time interval corresponds to the third position of the 3-way switch the signal SIG is no longer applied to the processor MMC under consideration (MMC4 for example). This explains that in FIG. 3b, which schematically represents the information acquisition process starting from the input signal SIG, switching to position 3 has no effect.

Thus, during this operational time interval ADC the capacitors which during the time interval W have stored the minimum and maximum values of the signal SIG are available for the read-out of these analog values.

After this description of the information acquisition process by the MMC processors it will be explained why a multiplicity of MMC processors is used.

As a capacitor, which cannot return from the value it has acquired at the end of a preceding operational time interval to a value which corresponds to the amplitude of the signal by an abrupt transition, is relatively slow and information storage and read-out cannot take place at the same instant, it is necessary to divide the time into different, adjoining elementary and operational time intervals if the signal is to be processed continuously.

In the present description of a preferred embodiment of the invention three operational time intervals have been selected, which in chronological order are the following: F, W, ADC.

These three time intervals constitute a sequence of operations for the acquisition and processing of information. This number of three, which has been given by way of example, may be changed without departing from the scope of the invention.

Each operation demands a longer or shorter time in view of the slowness of the relevant operational elements. In the present example, the operational time intervals have been selected as follows:

(F) = (W) = ½ (ADC) = $\alpha t$ ($\Delta t$ is the duration of an elementary time interval).

This explains why the input processor MMC has been quadrupled. In this way, there is no dead time in which a part of the information about the signal may be lost.

By using four MMC processors and selecting a number of operational time intervals as chosen previously by way of example, it is apparent that the first MMC should be capable of taking over from the fourth MMC, so as to enable the continuous acquisition of information about the signal during the successive adjoining operational time intervals W.

The operational time interval which follows and adjoins W is reserved for the read-out of the information stored in the form of capacitor charges.

This read-out of analog information may be utilized in a direct manner. It may be for example be used for any application for which the peak values of the signal must be known periodically. In this case the rest of the information processing chain in the device in accordance with the invention will not be operative.

This read-out may be performed in particular to convert the information which is acquired in analog form on the capacitor into information which is coded in digital form. This is the reason the operational time interval in which the analog-to-digital conversion is to be performed is designated ADC.

Analog-to-digital conversion is effected in 4 ADC-elements, numbered 21, 22, 23, 24 in FIG. 3a, because in the present embodiment the information is acquired by means of 4 elements MMC. The conversion result which appears at the output of the ADC-element, is constituted by two digitized information signals MA and Δ which respectively represent the maximum value (VM) and the difference (VM-Vm), which is designated Δs, which the signal SIG exhibits during the time interval W.

The digitized values MA obtained at the output of the ADC element (in the present example coded in the form of 6-bit words) are sequentially read out and routed to the element 5 in FIG. 3a via one single common channel.

The same applies to the values Δ. These two information channels are common interconnection channels between the modules.

The following section 5 of the device performs data processing (T.D.).

In the present example, this section is constituted by a plurality of integrated modules DIC whose internal structure is described hereinafter.

Combining a plurality of identical elements DIC is a simple and inexpensive means of realizing a more complex element.

The information processing element is not indispensable for the general operation of the device. However, its inclusion provides a greater flexibility of application and use of the device, optimized information processing, and a lower cost-price of the device.

In a first approach this information processing element makes it possible to compress the information to be stored. Thus, owing to this compression the bulk of the information to be stored will be reduced.

Consequently, a memory of reasonable capacity may be used for realizing the device in accordance with the invention.

As a result, the total cost of the device is reduced.

Information compression is effected as follows: if it is not desired or not necessary to follow the signal by means of short time intervals, the elementary time intervals, it is possible by means of this information processing element TD to take the maximum of the maxima (maximum maximorum) and the minimum of the minima (minimum minimorum) over several successive elementary time intervals (Δt).

In a way the time interval chosen for chopping the signal may thus be extended artificially. The new time interval, hereinafter referred to as measuring time interval (designated I.T.M.) is then related to the minimum elementary time interval Δt, by the expression ΔT=K. Δt, initially chosen as a compromise between the required performance of the device and the possibilities of current technology. The integer K can be programmed in accordance with the requirements of the user.

The element 6 is a digital information store. It stores the digitized values MA and MI which are applied to it in coded form and it is read out externally by the element S which is connected to the device. This element may be a display system or a computer or any other analyzing or display element.

In the case of a display the most interesting conventional display systems in view of their adaptation to the device in accordance with the invention are comparatively slow matrix display devices. In this case the memory serves to regulate the flow of information.

Thus, the digitized values MA and MI which are representative of the signal SIG in each elementary or measuring time interval are obtained at the output of the device in accordance with the present invention.

Figure 4:
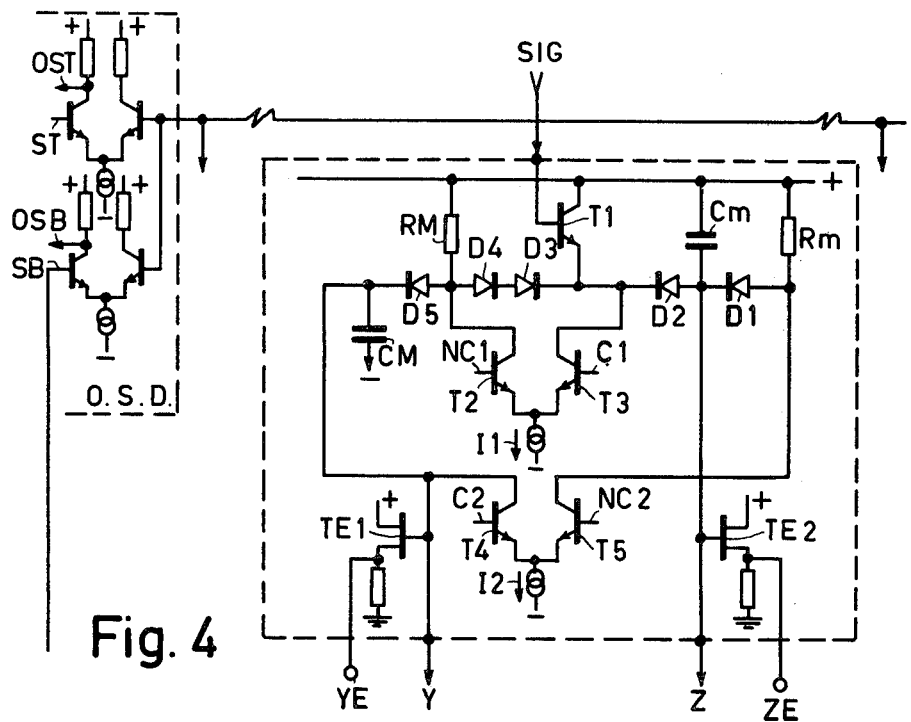
FIGS. 4 and 5 show examples of circuits for the first two stages of the device in accordance with the invention.
Figure 5:
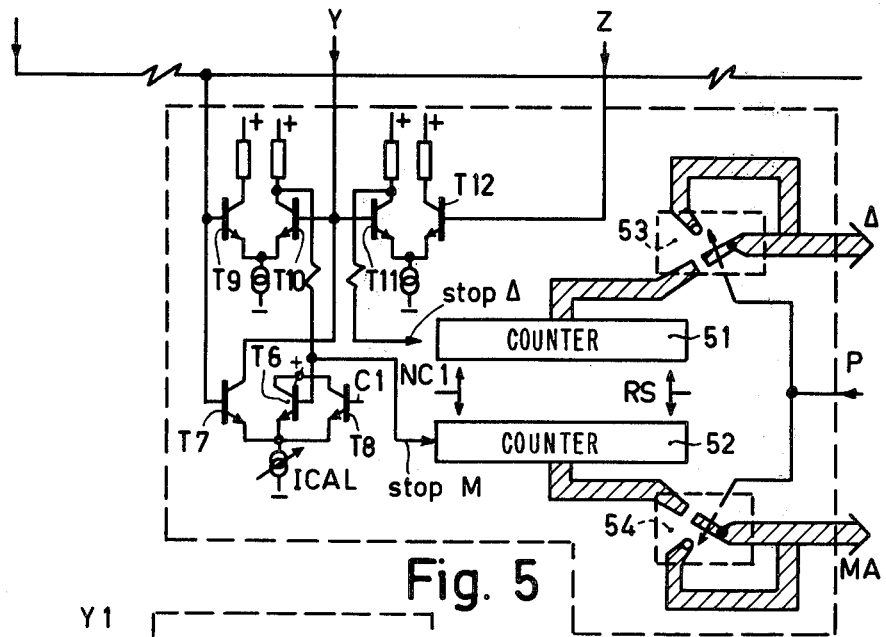

FIGS. 4 and 5 show an example of an MMC circuit and an analog-to-digital converter which is adapted to the output connections of the MMC circuit.

The signal SIG which is applied to the input of the four MMC elements is also applied to the associated circuit OSD (out-of-scale detector), which detects if the amplitude of the signal and its polarity are correct or if on the contrary the signal exceeds the scale for which the MMC element and the converter are proportioned. This scale is characterized by a scale bottom SB and a scale top ST. The detector applies a signal O or +V to points OSB, OST, SB and ST depending on whether the signal is out of scale (bottom, top) or within the scale (scale, bottom, connection X, scale top).

The MMC element comprises the elements of the FIG. 3b in electronic form.

The signal SIG which is applied to a source of low impedance (transistor $T_1$) charges the capacitors Cm(minimum) and CM (maximum) either directly or via diodes $D_5$ and $D_2$, whose thresholds are compensated for by diodes $D_3$, $D_4$ and via the base-emitter junction of $T_1$. The resistors RM and Rm bias the diodes $D_5$ and $D_1$.

Time-switching is effected electronically by the differential pairs $T_2$-$T_3$ and $T_4T_5$ which receive the levels $C_1$ or $\overline{C}_1$ ($NC_1$) and $C_2$ or $\overline{C}_2$ ($NC_2$), which are obtained by means of the central clock of the device. The current injectors $I_1$ and $I_2$ supply the pairs $T_2$, $T_3$ and $T_4$, $T_5$ with a constant current.

The two voltages Vm and VM which represent the amplitude minimum and the amplitude maximum are applied to the analog-to-digital converter via the connections Y and Z.

By means of the two transistors TE1 and TE2, which may for example be field-effect transistors, the two analog values Vm and VM can be obtained at the output points YE and ZE at high impedances. This is of particular interest for any application where the peak values of the signal must be know periodically.

The analog-to-digital converter digitally encodes the maximum value VM and the difference Δs=VM-Vm, in particular by means of two components 51 and 52 which are digital counters which determine the digital value Δ of the difference Δs (51) and the digital value MA of the maximum VM (52).

These two counters are controlled by 3 binary variables:
-$NC_1$ which should be 1 to release the counter and to start the counting process.
-RS(Reset) for resetting it to zero.
-STOP Δ and STOP M.

The only current generator ICAL ensures the correct calibration of the coding system for the two information signals VM and Δs.

The differential pairs constituted by the transistors $T_9$, $T_{10}$ and $T_{11}$, $T_{12}$ serve to determine the binary variables STOP M and STOP Δ in accordance with the presetted ICAL of the current generator, which also supplies the differential pair $T_7$, $T_6$, $T_8$ which performs the time-switching function.

The operation of the analog-to-digital converter will now be described in more detail. The two elements 53 and 54 are electronic switches. They are realized by means of conventional logic circuits and they enable the results of the two operations performed by the two counters 51 and 52 during the corresponding operational time interval ADC to be transmitted over the two common interconnection channels. Since there are 4 analog-to-digital converters each of them elements in turn transmits the results over the interconnection channels. In order to prevent information from being transmitted outside the operational time interval in which the information words are transmitted, these switches are time-dependent.

A variable P, which is related to the central clock, sets the switches in such a way that they transmit information only during the operational time interval of the relevant module.

Figure 6:
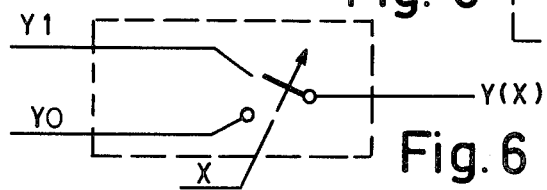
FIG. 6 represents an electronic switch as employed in the examples of FIGS. 5 and 8.
Figure 7:
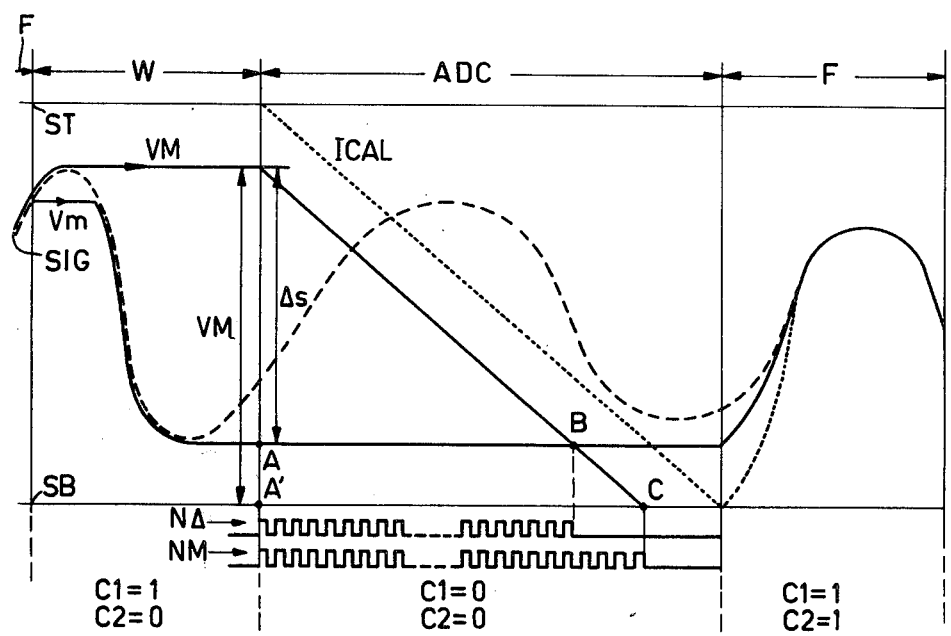
FIG. 7 is a time diagram which illustrates the operation of the combination of the information-acquisition means and analogue-to-digital converter.

The truth table of an electronic switch as shown in FIG. 6 is as follows:
If $X = 0$, then $Y = Y_0$
If $X = 1$, then $Y = Y_1$ FIG. 7 illustrates the operation of the first two steps of acquisition and conversion. During the operational time interval W, in which the switching variables $C_1$ and $C_2$ have the values $C_1 = 1$ and $C_2 = 0$ (i.e. $NC_1 = 0$, $NC_2 = 1$) the analog stores (capacitors) store the minimum (Vm) and the maximum values (VM) of the signal SIG between the levels SB, ST. Subsequently, these values are digitally coded in the analog-to-digital converter in which they are referred to the level SB. Coding is effected during the operational time interval ADC in the following manner:

A circuit which comprises transistors $T_6$, $T_7$, $T_8$, (FIG. 5) discharges the capacitor CM in a linear fashion.

To ensure that the discharge conditions are always the same, the current generator ICAL is adjustable, so that always the same discharge curve (designated ICAL in FIG. 7) is obtained.

From the initial value VM, to which the capacitor CM is charged, first the minimum value is reached, which in the meantime has not changed because it is retained by Cm. At this point, which is designated B in FIG. 7, the counter 51 of the analog-to-digital converter is stopped by bringing the variable STOP Δ to 1-level. Thus, the counter Δ has counted a number of N Δ clock pulses which have appeared in the time interval AB. This digitally coded number N Δ represents the value of Δs.

It is transmitted over the common interconnection line via the electronic switch 53, for example during the next operational time interval F.

The voltage on the capacitor CM which has been discharged, eventually reaches the minimum threshold SB, which is the lower limit of the selected scale, at point C. At this point, the second counter MA (52, FIG. 5) is stopped by bringing the variable STOP (M) to 1-level.

The number of pulses $N_M$ appearing during the time interval A'C represents the digital value of VM. This number which has been digitally coded by the counter 52 is transmitted over the common interconnection channel MA via the electronic switch 54, for example during the next operational time interval F.

During the operational time interval ADC the switching variables have the following values:
$C_1 = 0$ ($NC_1 = 1$)
$C_2 = 0$ ($NC_2 = 1$)

Subsequently, during the following operational time interval F, the capacitors are again charged by the signal.

Starting from the previous value Vm for Cm and the value SB for CM, the voltages on the capacitors will progressively assume the value of the signal until they perfectly follow this signal as shown in FIG. 7 during the interval labelled "F". This period is a recovery time for the capacitors which have a certain inertia. The switching variables then have the values:
$C_1 = 1$
$C_2 = 1$
($NC_1 = 0$)
($NC_2 = 0$)

Figure 8:
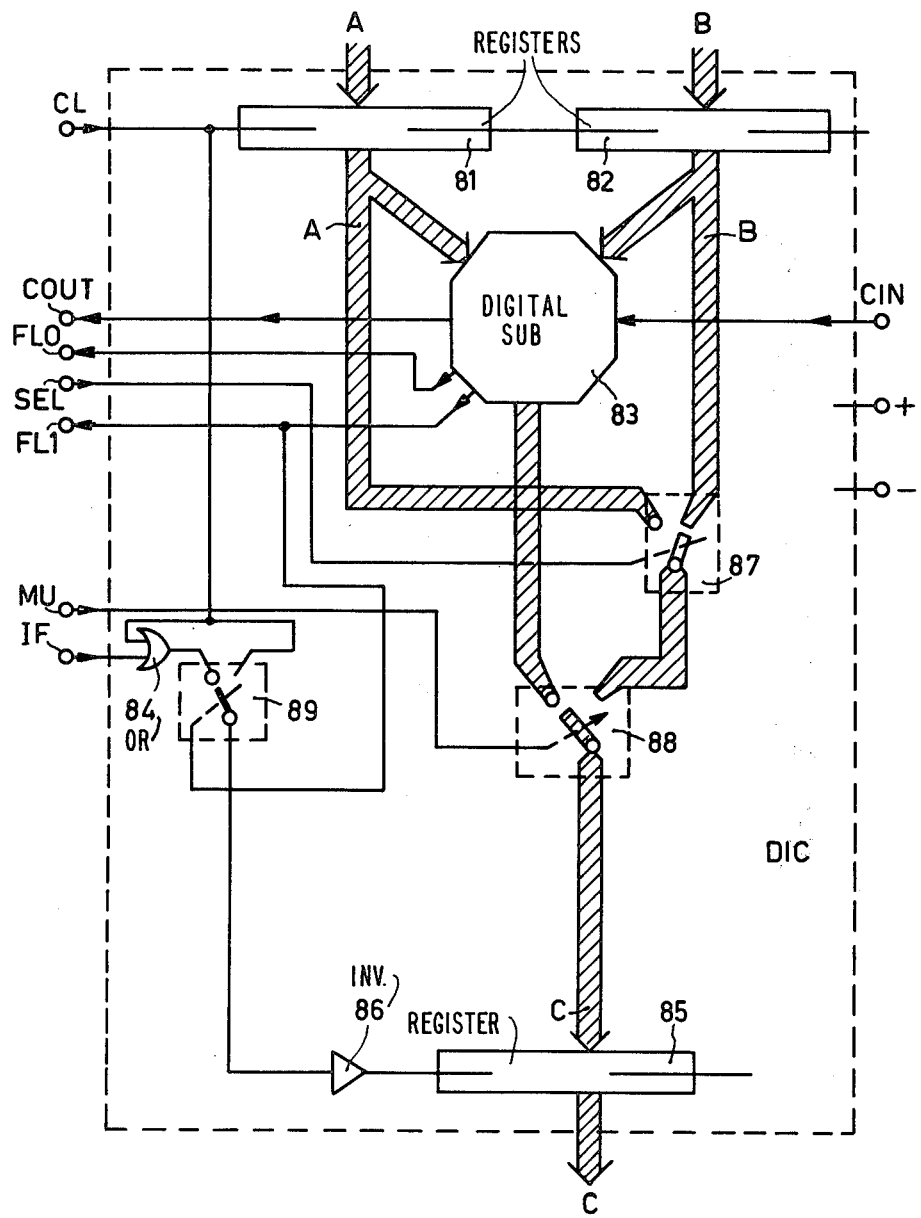
FIG. 8 shows the internal structure of the basic electronic module which performs a comparison between the inputs, and which constitutes an information processor as shown in the next Figure.

In FIG. 8 shows the internal structure of a programmable integrated module DIC, which, as previously described, constitutes the information processing element TD to be described later. The operation of the various elements which constitute the module as a function of the parameters applied to it, is explained with the aid of Table 1 which is the truth table of this module.

TABLE I

| CL | MU | SEL | SIN | IF | C | FL0 | FL1 |
|---|---|---|---|---|---|---|---|
| 0 | * | * | 1 | * | = C | 0 If A ≧ B<br>1 If A < B | 0 If A ≦ B<br>1 If A > B |
|   |   |   | 0 |   |   | 0 If A ≧ (B+1)<br>1 If A < (B+1) | 0 If A ≦ (B+1)<br>1 If A > (B+1) |
|   |   |   |   | + | A − B |   |   |
|   | 0 | * | 1 | 1 | A − B If A > B<br>= If A > B |   |   |
|   |   |   |   | 0 | A − (B+1) |   |   |
|   |   |   | 0 | 1 | A − (B+1) If A > (B+1)<br>C Si A ≦ (B+1) |   | * |
|   |   |   |   | 0 | A |   |   |
| 1 | 0 |   | 1 | 1 | A If A > B<br>= C Si A ≦ B | = FL0 | = FL1 |
|   |   |   |   | 0 | A |   |   |
|   | 1 |   |   | 1 | = C If A ≦ (B+1) |   |   |
|   |   |   |   | 0 | B |   |   |
|   |   | 1 | 1 | 1 | B If A > B<br>= C If A ≦ B |   |   |
|   |   |   |   | 0 | B |   |   |
|   |   |   | 0 | 1 | B If A > (B+1)<br>= C If A > (B+1) |   |   |

(An asterisk * denotes that the value of the parameter is irrelevant)

- CL is the clock which synchronizes the complete operation of the device in accordance with the invention.
- MU is the multiplexing parameter.
- SEL selects one of two input-data words.
- IF is a conditional parameter,
- CIN and CQUT are input and output carries which enable extensible-format comparison operations to be effected by means of a plurality of DIC elements.
- FL0 and FL1 are indicators for the release by a trigger-level signal at one of the inputs of the DIC element.

The two input registers 81 and 82 receive the input data words A and B before they are compared. They are applied to the operator 83 which digitally subtracts the two words A and B.

Subsequently the result of this subtraction is applied to the electronic switch $CEC_2$ (88) which like the switches $CEC_1$ and $CEC_3$ responds to values of the various parameters in accordance with Table 1. The result is applied to the register 85, which enables or does not enable the output in accordance with the command which it receives via the inverter 86 from the command logic which comprises the OR gate 84 and the electronic switch 89.

Figure 9:
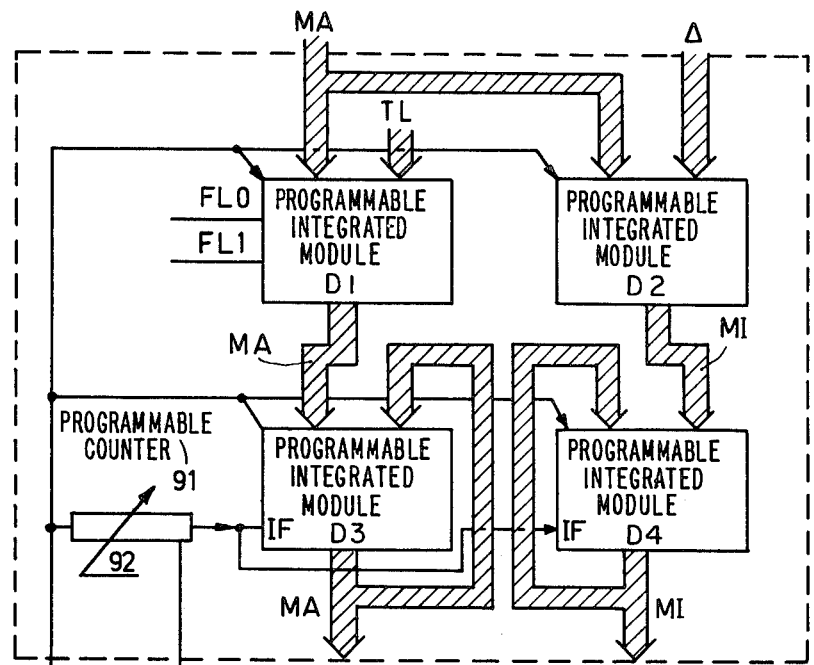
FIG. 9 shows the internal structure of the information processor.

FIG. 9 shows the data processor which comprises 4 DIC elements. The values of the parameters selected for each of them are as follows:

| | | | |
|---|---|---|---|
| $D_1$ | MU=1 | SEL=0 | IF=0 |
| $D_2$ | MU=0 | SEL=0 | IF=0 |
| $D_3$ | MU=1 | SEL=0 | IF in accordance with the command given by the counter 91. |
| $D_4$ | MU=1 | | |

Upon $D_1$ the digital value MA and a digital parameter TL (from trigger level) are introduced. Thus $D_1$ will detect during each operational time interval W if the analyzed signal has an amplitude which is at least equal to the programmed trigger level TL or which is below said level. This detection will manifest itself at the outputs FL0 and FL1 which are the indicators for the release by the trigger-level signal TL. At the output of $D_2$ the value MI will be obtained.

The last two DIC modules enable the information MI and MA to be compressed. Owing to the control means 92, which digitally influences a programmable counter 91 which divides the clock frequency H, the value of the multiplication constant K can be changed.

The measuring time interval, as described previously, has the value: $\Delta T = K \cdot \Delta t$ ($\Delta t$ is the elementary time interval). In a measuring time interval DIC 3 and 4 will determine the minimum minimorum and the maximum maximorum (or the minimum and the maximum) of the analyzed signal.

A divided clock-frequency output HTD enables the memory in with a constant rhythm.

The data processor of FIG. 9 is not indispensible for the operation of the device in accordance with the invention. Indeed, it may be desired to have only the digital information which represents the amplitude minimum and maximum of the signal during each elementary time interval (with K=1). In this case the digital information store may be connected to the output of the analog-to-digital converter. If the values MI and MA are to be stored and a trigger level TL is required, only two DIC elements (instead of 4) may be included, in this case the first two DIC elements.

Figure 10:
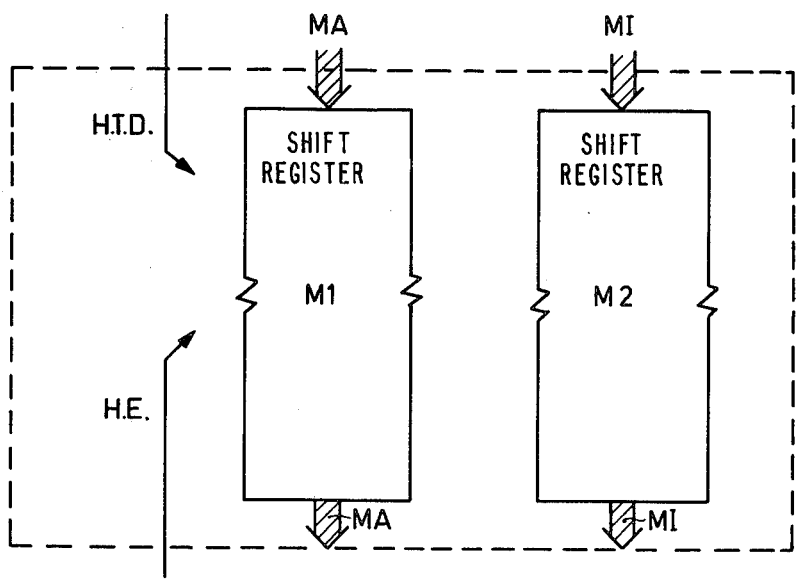
FIG. 10 shows the last stage of the device: a memory.

FIG. 10 is a schematic diagram of the memory. $M_1$ and $M_2$ are for example two shift registers, one for the minimum, the other for the maximum. These memories are read-in in the rhythm of the clock frequency HTD from the data processor. In general, read-in can be effected in a slower rhythm of an external clock signal obtained from the equipment which is connected to the output of the device in accordance with the invention (H.E.).

For example in the case of a matrix display system with a long response time, the memory shown in FIG. 10 will be a buffer memory.

Each analog-to-digital converter supplies two words of X bits per elementary time interval (2 × X bits) and if the signal is to be stored during N elementary time intervals, it follows that the capacity of this memory should be 2 × N × X bits.

If for example a signal with a frequency F = 100 MHz (1/F = 10 ns) is to be analyzed with 100 elementary time intervals (i.e. during 1 μs), each time interval consequently having a duration of 10 ns, and if coding is effected in 6 bits (X = 6), the required storage capacity will be 2 × 100 × 6 = 1200 bits. For the conventional method this would have been at least 6000, if it should be applicable for an arbitrary signal.

Moreover, by adjusting the constant K, the signal envelope can be stored, or it is possible to store the signal or its envelope for a longer time.

If for example the storage capacity is N words, (of 2 × X bits each) and if the signal is to be followed during M elementary time intervals, K is adjusted so that each storage word corresponds to a measuring time interval of (M/N) ΔT. During this time the information will be constituted by the minimum minimorum and the maximum maximorum of this signal, which may be constituted by the minimum and the maximum of the signal if the upper frequency of said signal is smaller than (1/M/N) ΔT.

The device in accordance with the invention may be employed in conjunction with any signal analysis arrangement or instrument.

In a preferred embodiment a matrix display device may readily be connected to the output of the digital data store, then consisting of a buffer store, which comprises the acquisition and storage device.

The basic idea is to display vertical segments which lie between the minimum amplitude and the maximum amplitude which the signal assumes during an elementary time interval (ITE) or during a plurality of elementary time intervals.

Figure 11:
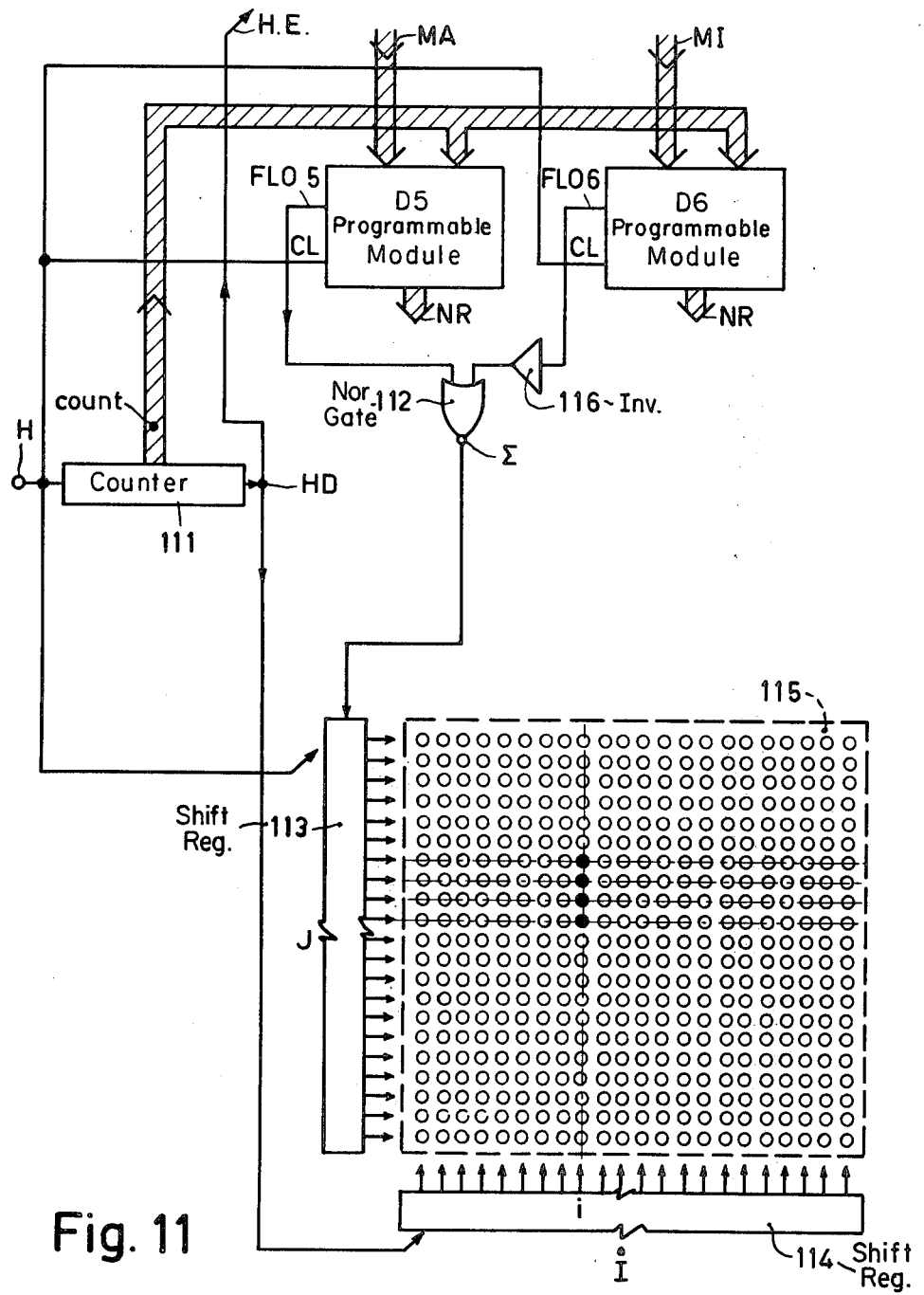
FIG. 11 is a block diagram with a matrix display panel.

FIG. 11 shows a preferred embodiment of the matrix display device. The digital information obtained from the acquisition and storage device, which information has been entered into the digital information store in a fast rhythm, is transferred to two programmable modules D5 and D6 (DIC modules) in a slower rhythm (designated HE in the Figure).

The maxima (or the minima respectively) are transferred in the rhythm HE to one of the inputs of the module D5 (or D6 respectively). The rhythm HE is obtained by means of a single clock circuit of the conventional type (designated CL), whose frequency is divided by means of a counter 111. The count of this counter 111, i.e. the binary-coded number of clock pulses counter by 111, is transferred in the clock rhythm to the other input of the preceding modules D5 and D6 upon each clock pulse and with the next clock pulse.

The undivided clock frequency H is also applied to the clock input CL of the two modules D5 and D6. In respect of the divided clock frequency (designated HD), this frequency does not only constitute the rhythm (HE) with which the digital information store is read out, but it also forms the horizontal address rhythm of the matrix display system 115, i.e. it corresponds to the activation of successive column points.

The outputs FL05 and FL06 of the two modules D5 and D6 are applied either directly for FL05, or in an inverted manner for FL06 (inverter 116) to a logic NOR-gate 112 which loads (output Σ) a shift register 113, which assures the vertical address of the matrix display system 115. The circuits 113 and 114 are therefore both conventional shift register circuits.

The modules D5 and D6 are programmed as follows (values of the parameters):

D5 CIN=1 MU=1 SEL=arbitrary IF=O
D6 CIN=0 MU=1 SEL=arbitrary IF=O

The digital outputs of the modules D5 and D6 are not connected and have no function in the present case shown in the Figure.

Figure 12A:
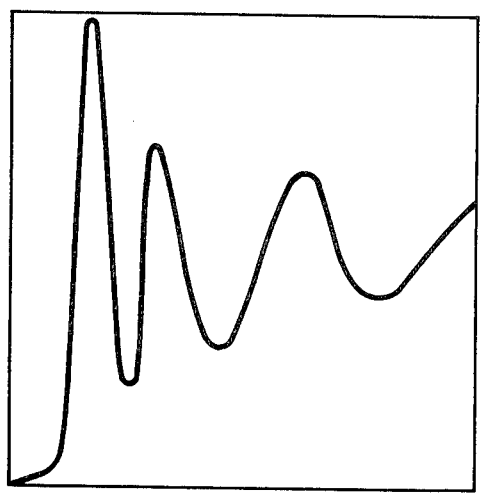
FIG. 12a represents an electrical signal as a function of time.
Figure 12B:
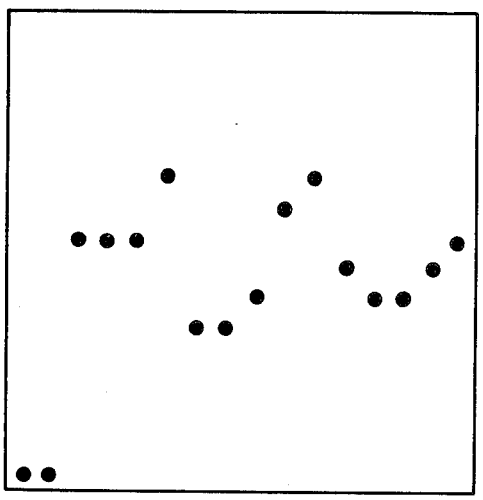
FIG. 12b shows this signal displayed in accordance with known sampling techniques.
Figure 12C:
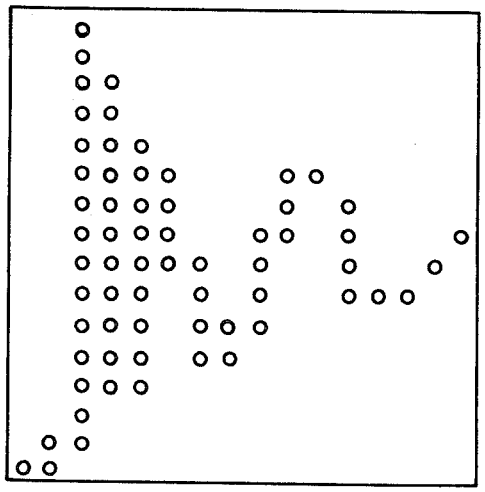
FIG. 12c shows this signal displayed by means of the device of FIG. 11.

The operation of such a matrix display device is illustrated by FIG. 12.

FIG. 12a shows an arbitrary electrical signal to be analyzed. FIG. 12b illustrates the operation of an arbitrary conventional display system. Generally the analysis of electrical signals, performed in different manners, is visualized with the aid of a single image point in a coordinate system.

It is found that the device operates so that for each column of the matrix display system all the points situated between the two points which respectively correspond to the digitized values of the amplitude maximum and amplitude minimum of the signal during the measuring time interval (ITM) corresponding to the relevant column are activated successively.

Thus, this representation of the signal always reveals its exact envelope, even if the period of the input signal is smaller than the duration of an elementary time interval, rather than some values which are not always representative of the amplitude which the signal may assume during the successive time intervals.

The display system 115 comprises I columns and J rows that can be addressed. It is easy to determine I and J: If the amplitude of the signal is to be quantified in accordance with X levels (analog-to-digital conversion), the number of lines J consequently equals $2^X$. For example for 6 levels, this would give 64 rows. The number of columns I is related to the storage capacity. Indeed, if it is required to display the signal during N measuring time intervals, I=N columns (for example 64) are needed on the display system. The storage capacity will then be: $2 \times X \times N$ (for example $2 \times 6 \times 64 = 768$ bits).

The operation of the display device is described hereinafter with reference to Table 2.

$$\Sigma = FL05 + \overline{FL06} = \overline{\overline{FL05} \cdot FL06}$$

$\Sigma$ will then be 1 between the values 16 and 24 including the limits, which corresponds to the segment displayed on 115.

It is evident that the preceding description has been given only by way of non-limitative example and that variants are conceivable without departing from the scope of the invention.

What is claimed is:

1. A device comprising at least one element means for sampling an analog signal and for acquiring amplitude maximum and amplitude minimum information about said signal during successive elementary time intervals of selected duration, said sampling means including at least three channels each having switch means operable to cause bilateral signal sampling and unilateral signal sampling of said maximum and minimum amplitudes in different respective operational time intervals and for providing said maximum and minimum amplitudes information in another operational time interval said channels being time division multiplexed whereby said unilateral sampling intervals in different channels adjoining one another in time; a plurality of analog to digital converter means disposed in said channels respectively and coupled to said switch means for converting said information into digital values and for sequentially providing said values; an information processing element coupled to said converter comprising programmable digital comparator circuit means for determining maximum of the maxima and the minimum of the minima of the signal during a selected number of said elementary time intervals, and a digital counting circuit means coupled to said comparator circuit means for programming said number; and means for storing digital values corresponding to said maximum of the maxima and minima of the minimum.

2. A device as claimed in claim 1, wherein the analog-to-digital converter is of the amplitude-time type and provided for digitally coding the two amplitudes of which one amplitude is always higher than the other for a varying signal comprises a single constant-current

TABLE 2

| H | |
|---|---|
| COUNT | |
| | 0 1 2 3 4 5 6 7 8 9 10 11 12 13 14 15 16 17 18 19 20 21 22 23 24 25 26 27 28 29 30 31 |
| | Signal |
| |                            Minimum MI       Maximum MA |
| FL05 | 0 0 0 0 0 0 0 0 0 0 0 0 0 0 0 0 0 0 0 0 0 0 0 0 0 1 1 1 1 1 1 1 |
| FL06 | 0 0 0 0 0 0 0 0 0 0 0 0 0 0 0 0 0 1 1 1 1 1 1 1 1 1 1 1 1 1 1 1 |
| | 0 0 0 0 0 0 0 0 0 0 0 0 0 0 0 0 0 1 1 1 1 1 1 1 1 0 0 0 0 0 0 0 |

This table relates to an example in which X equals 5 (32 levels). During the relevant measuring time interval corresponding to the column i of the display system, the signal has 16 as its minimum and 24 as its maximum. The programmable modules D5 and D6 compare the digitized information MA and MI from the digital information store with the count of the counter 111.

In accordance with the previously indicated programming of the modules D5 and D6 FL05 will be zero if MA $\geq$ COUNT and FL06 will be zero if MI $\geq$ COUNT +1.

After having passed through 116 and 112, the output signal $\Sigma$ applied to the register 113 will have the value:

calibration generator and two digital counting circuits coupled to said generator and together having two output means for producing the digital value of the upper voltage with respect to a reference level and the digital value of the difference between the two voltages respectively.

3. A device as claimed in claim 1, wherein the information processing element comprises a digital control means for a storage trigger level and an indicator means of said level for release by the signal.

4. A device as claimed in claim 1, wherein the programmable digital comparators have a carry input-output means for performing the comparison operations with an extensible format.

5. A device as claimed in claim 1, further comprising matrix display devices having slow response times coupled to said storing means, and wherein the digital information store comprises a buffer store which is read in with a fast rhythm and read out with a slow rhythm corresponding to the response times of said matrix display devices.

6. A device as claimed in claim 5, further comprising means for ensuring that for each column under consideration of the display system all the points which are situated between the two points which respectively correspond to the digitized values of the amplitude maximum and amplitude minimum which the signal assumes during the measuring time interval corresponding to the column under consideration are activated successively.

* * * * *